United States Patent
Hammel et al.

[19]

[11] Patent Number: 6,156,217

[45] Date of Patent: Dec. 5, 2000

[54] METHOD FOR THE PURPOSE OF PRODUCING A STENCIL MASK

[75] Inventors: Ernst Hammel, Voorburg, Netherlands; Hans Löschner, Vienna, Austria; Ivaylo W. Rangelow, Baunatal, Germany

[73] Assignee: IMS-Ionen Mikrofabrikations Systeme GmbH, Vienna, Austria

[21] Appl. No.: 09/180,268

[22] PCT Filed: May 13, 1997

[86] PCT No.: PCT/AT97/00096

§ 371 Date: Apr. 30, 1999

§ 102(e) Date: Apr. 30, 1999

[87] PCT Pub. No.: WO97/43694

PCT Pub. Date: Nov. 20, 1997

[30] Foreign Application Priority Data

May 13, 1996 [AT] Austria ........................................ 844/96
Sep. 6, 1996 [AT] Austria ...................................... 1587/96

[51] Int. Cl.⁷ .............................. B44C 1/22; H01L 21/31; C03C 25/68; C23F 1/08; C25F 3/00
[52] U.S. Cl. ................................ 216/12; 216/17; 216/41; 438/701
[58] Field of Search ................................ 216/17–19, 12, 216/41; 438/700, 701, 702

[56] References Cited

U.S. PATENT DOCUMENTS 4,013,502 3/1977 Staples .
4,919,749 4/1990 Mauger et al. .
4,966,663 10/1990 Mauger .

FOREIGN PATENT DOCUMENTS 0 019 779 B1 12/1980 European Pat. Off. .
0 367 750 A3 5/1990 European Pat. Off. .
0 542 519 A1 5/1993 European Pat. Off. .
0 399 998 B1 9/1998 European Pat. Off. .
195 27 314 A1 2/1996 Germany .
WO 96/38763 12/1996 WIPO .

*Primary Examiner*—Richard Bueker
*Assistant Examiner*—Alva C Powell
*Attorney, Agent, or Firm*—Ladas & Parry

[57] ABSTRACT

A method for the purpose of producing a stencil mask, which comprises a sheet having structures in the form of orifices, wherein the method comprises the following sequence of steps:

a) selecting a planar, two-dimensional substrate consisting of a specific material comprising a thickness greater than 50 μm, b) producing a thin layer, the so-called intermediate layer on the upper side of the substrate, c) structuring this intermediate layer by means of a lithographic process with the structures for the mask which is to be produced, d) etching the lower side of the substrate at least in the region of the structures provided for the mask orifices, until the substrate comprises in this region a predetermined membrane thickness less than 50 μm, e) etching the upper side of the membrane using the structured intermediate layer as a masking layer, in order to form in this membrane the orifices of the mask which orifices correspond to the structures of the intermediate layer, and f) removing the intermediate layer.

8 Claims, 6 Drawing Sheets

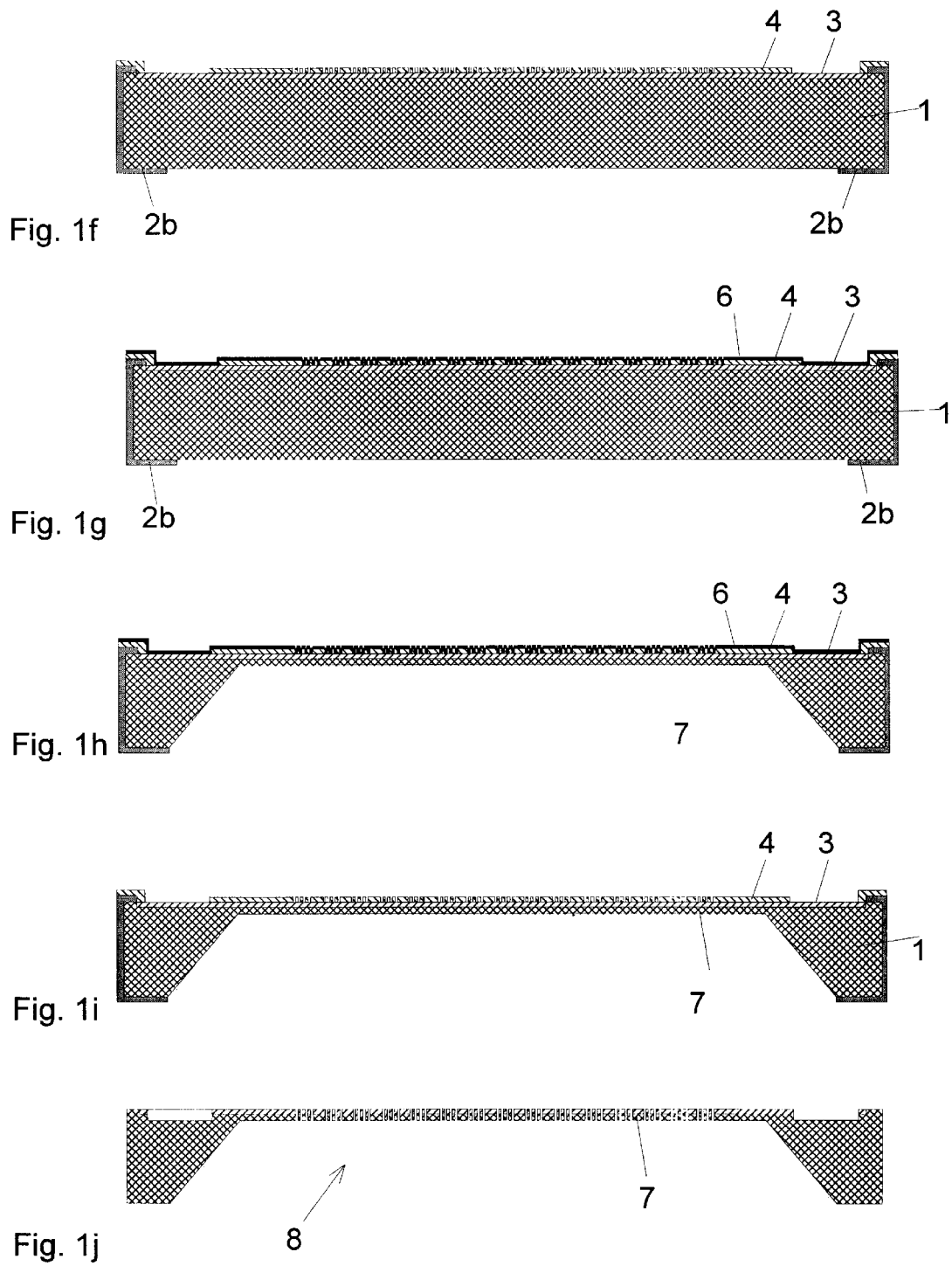

METHOD FOR THE PURPOSE OF PRODUCING A STENCIL MASK

FIELD OF THE INVENTION

BACKGROUND

The present invention relates to a method for the purpose of producing a stencil mask, namely an arrangement which comprises inter alia a planar sheet having a plurality of openings.

SUMMARY OF THE INVENTION

It is particularly difficult to produce stencil masks if they are to be produced over a large area with a small thickness, e.g with a diameter larger than 5 cm and a thickness in the range of 0.25 to 50 μm and furthermore if they have an orifice structure comprising extremely small dimensions in the μm or sub-μm range. Masks of this type are used in the case of a plurality of processes, e.g lithographic applications, for ion-implantation, ion beam etching, vapour-depositing, and as grid lenses or the like.

Known production methods generally comprise thin-etching of thick substrates, e.g of silicon wafers. The orifice structure of the mask can be produced, either prior to or after thin-etching the substrate, by means of a lithographic process. In the first case (mask structure is produced prior to the thin-etching procedure), it is necessary during the thin-etching procedure to protect the orifice structure from being etched, e.g by filling with a specific material which subsequently must be completely removed again. A method of this type is taught in U.S. Pat. No. 4,013,502. EP 0 019 779 also discloses a similar approach. In the second case (orifice structure is produced after the thin-etching procedure), all of the process steps required for the structuring must be performed on the thin sheet, so that said thin sheet can be easily impaired or damaged.

In EP 0 542 519 A from line 28 of column 8 there is described a method for the purpose of producing a mask structure, wherein the rear side of the wafer is etched away up to the thickness of the membrane and then the design of the mask is produced in a lithographic manner on the upper side of the membrane.

The etch-stop of the membrane is achieved by doping a layer, wherein the doping must be highly concentrated such that thereby an extremely high degree of stress is produced in the membrane. A coating in the form of a multilayer dielectric coating is used in order to compensate for this stress.

A disadvantage of this known production method thus resides inter alia in the fact that both the protection of the orifices and the subsequent further treatment of a sheet or membrane are extremely time consuming and therefore expensive.

Therefore, it is the object of the present invention to provide a new method for the purpose of producing stencil masks whilst avoiding the aforementioned disadvantages, which method can be implemented in a convenient and cost-effective manner and minimizes the changes in the mechanical stress characteristics during production. In particular, already known and readily attainable manufacturing technologies can be used, e.g technologies which have been developed for the production of semi-conductors.

In accordance with the invention, these objects are achieved in the case of a method which comprises the following sequence of steps:

a) selecting a planar, two-dimensional substrate consisting of a specific material comprising a thickness greater than 50 μm, b) producing a thin layer, the so-called intermediate layer on the upper side of the substrate, c) structuring this intermediate layer by means of a lithographic process with the structures for the mask which is to be produced, d) etching the lower side of the substrate at least in the region of the structures provided for the mask orifices, until the substrate comprises in this region a predetermined membrane thickness less than 50 μm, e) etching the upper side of the membrane using the structured intermediate layer as a masking layer, in order to form in this membrane the orifices for the stencil mask which orifices correspond to the structures of the intermediate layer, and f) removing the intermediate layer.

By virtue of this sequence of steps, the method steps, which are required for the structuring and which cause mechanical loadings, are undertaken prior to the thin-etching procedure, whereas the etching of the mask orifices is not actually performed until after the thin-etching procedure, in order to prevent these orifices from becoming contaminated or impaired during the thin-etching procedure.

Advantageous embodiments of the method in accordance with the invention are evident in the dependent subordinate claims.

BRIEF DESCRIPTION OF THE FIGURES OF THE DRAWINGS

Further features and advantages of the method in accordance with the invention are evident in the non-limiting description hereinunder of exemplified embodiments, wherein reference is made to the attached Figures, in which FIGS. 1a to 1j show a first exemplified embodiment for the purpose of implementing the method.

DETAILED DESCRIPTION

Figure 1A:
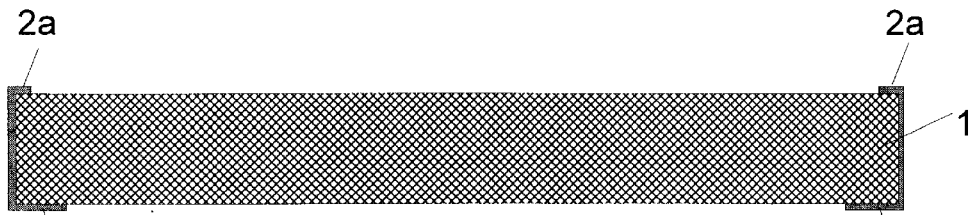

Firstly, reference is made to the FIGS. 1a 1j, which illustrate in a schematic manner a first, non-limiting exemplified embodiment of the method in accordance with the invention.

FIG. 1a shows a two-dimensional semi-conductor substrate 1 of a specific conductivity type, e.g a p-conductive silicon wafer, which is provided along its edging both on the upper side and on the lower side with a masking 2a, 2b, e.g a silicon oxide layer in order to remove this edging in the subsequent method steps of processing.

Figure 1B:
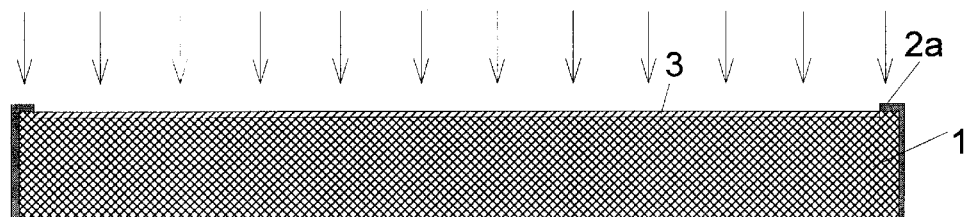

In the subsequent method step illustrated in a schematic manner in FIG. 1b, the upper side of the substrate 1, which is located within the masked region 2a, is doped, e.g by ion-implantation with phosphorous or arsenic ions, in order to produce on this upper side an n-doped layer 3 having a predetermined thickness. The selection of the doping material, the doping depth and the doping concentration depends substantially upon the subsequently used thin-etching method and upon the desired stress characteristics of the mask which is to be produced. The required parameters for this are known to the skilled person in this field and as a result will not be explained in detail at this juncture. In particular, reference is made in this context to parallel applications by the Applicant, inter alia the applications DE 195 27 314 and PCT AT95/00111, which are to be considered expressly as a part of this disclosure.

Conventionally, the doping material, which is implanted by virtue of ionic bombardment, is activated after the ion-implantation by thermally annealing the substrate.

Figure 1C:
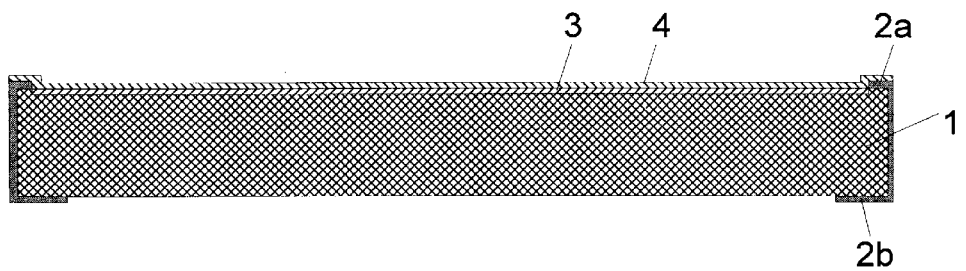
Figure 1D:
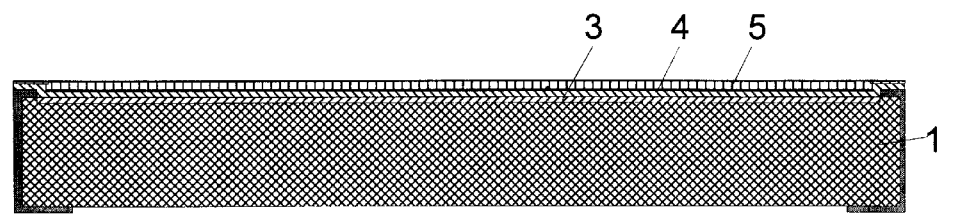

On the upper side of the doped layer 3 of the substrate 1 a thin intermediate layer 4 is then produced, e.g a SiON-layer having a thickness of 1 $\mu$m, which grows thermally in a atmosphere which is enriched with oxygen and nitrogen (FIG. 1c). In the present case of a silicon wafer, it is also possible to apply a pure oxide layer ($SiO_2$) or a pure nitride layer ($Si_3N_4$) as an intermediate layer. Likewise, within the scope of the present invention, it is also possible to produce different layers which can be structured, e.g vapour-deposited, chemically or electrochemically produced layers, which are sufficiently stable for subsequent processing.

Figure 1E:
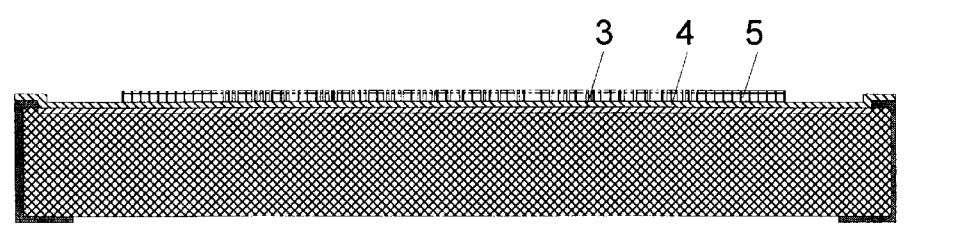

In the sequence, the intermediate layer 4 is structured by means of a lithographic process having the structures of the mask which is to be produced. For this purpose a resist layer 5 is applied to the upper side of the intermediate layer 4 and is suitably exposed and developed. Subsequently, the intermediate layer 4 is etched in the structured regions as far as to the upper side of the substrate 1 and the still present resist layer is removed (FIGS. 1e, 1f). Lithographic processes of this type are known to the person skilled in the art and will also not be explained in detail at this juncture.

Subsequently, a conductive protective layer, e.g a metal layer 6 (such as TiW) is vapour-deposited or deposited on to the structured intermediate layer 4. In the present case, this metal layer 6 has a dual function, namely on the one hand to protect the structures of the intermediate layer from being etched, and on the other hand to form an electrode for the subsequent electrochemical etch-stop method.

The electrochemical etch-stop method already discussed serves to etch the substrate from the lower side in the region within the masked edging 2b, until a membrane 7 having a predetermined thickness, e.g having a thickness amounting to several $\mu$m, remains in this region. In the case of the electrochemical etch-stop method the etching process is stopped automatically by virtue of an electrochemical passivation shortly before the p/n transition is achieved in the proximity of the boundary surface between the undoped substrate 1 and the doped layer 3. A method of this type for the purpose of thin-etching silicon substrates is described in detail inter alia in the European applications EP 367 750 and EP 399 998 by the Applicant. The contents of the disclosure of these European applications can thus be expressly considered as a part of the present disclosure. However, within the scope of the present invention all other known methods of thin-etching a substrate can be employed.

After the thin-etching procedure (illustrated in FIG. 1h), the metal protective layer 6 on the upper side of the structured layer 4 is removed, so that the structures of this masking layer become visible once again (FIG. 1i). When using a TiW protective layer, hydrogen peroxide ($H_2O_2$) is recommended for the purpose of removing this layer.

In order to produce a stencil mask 8, the membrane 7 is now etched through the structures of the intermediate layer 4, e.g by reactive ion bean etching, until orifices are produced in these non-masked regions of the membrane 7, which orifices form the structures of the mask 8. Finally, the intermediate layer 4 is removed. FIG. 1j shows the stencil mask immediately after the production process has been completed.

Furthermore, it is evident in FIGS. 1e to 1j that in the region of the edging of the mask there are provided structures which are not formed as orifices. These structures typically serve to align the mask.

FIGS. 2a to 2j illustrate in a schematic manner a further, non-limiting exemplified embodiment for the method in accordance with the invention.

Figure 2A:
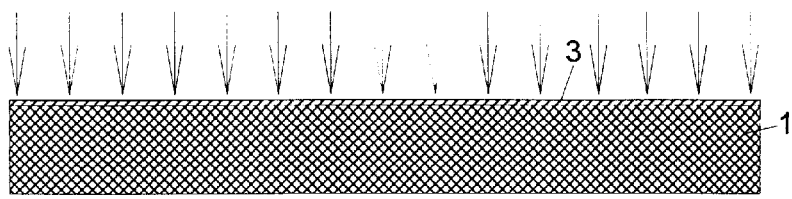
FIGS. 2a to 2j show a second exemplified embodiment for the purpose of implementing the method and FIGS. 3a to 3i show in a schematic manner a sequence of steps for the purpose of implementing the method in accordance with the invention.
Figure 2B:
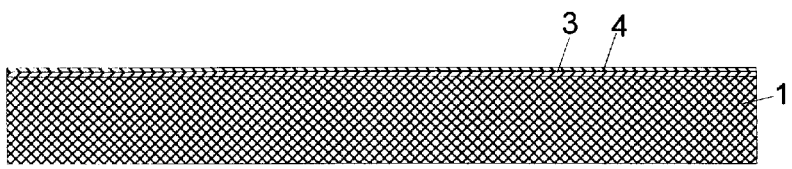
Figure 2C:
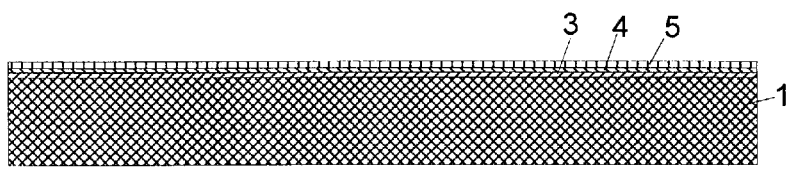
Figure 2D:
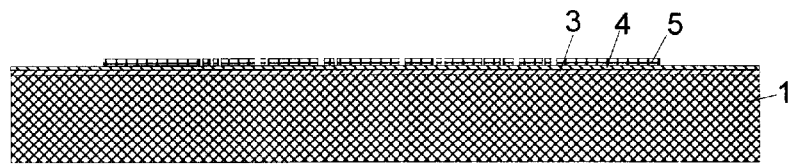
Figure 2E:
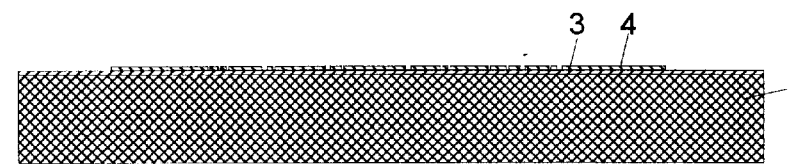
Figure 2F:
Figure 2G:
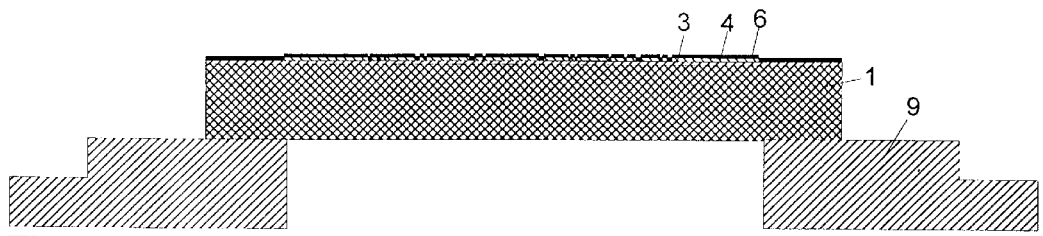
Figure 2H:
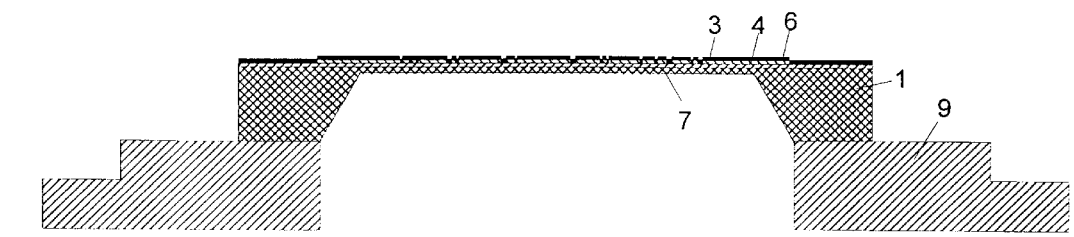
Figure 2I:
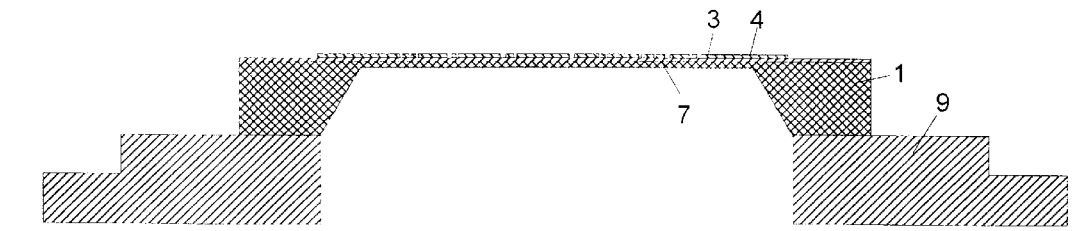
Figure 2J:
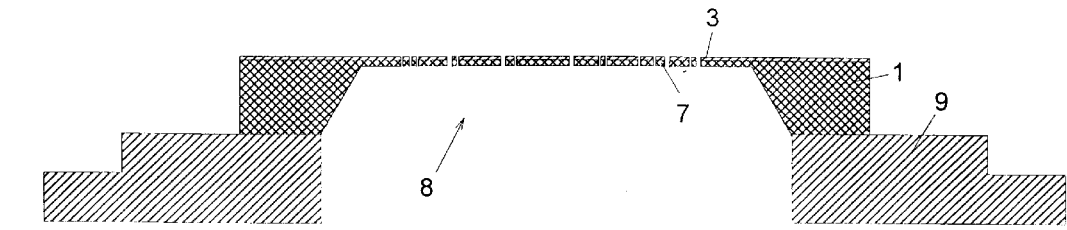

As is evident in FIG. 2a, in contrast to the above-described exemplified embodiment (cf. FIG. 1a), maskings are not produced initially on the edges of the substrate 1.

The method steps, which are illustrated in FIGS. 2a to 2f, correspond substantially to those illustrated in FIGS. 1b to 1g and described in detail above, so that these method steps will not be described again at this stage.

It is evident in FIG. 2 that the substrate 1 is now attached with its lower side along the edging to a stable frame 9, e.g a Pyrex or a silicon ring.

The substrate 1 together with the frame 9 is now directed to further processing. The subsequent method steps illustrated in FIGS. 2h to 2j correspond substantially to the method steps, which are illustrated in FIGS. 1h to 1j and are described further above with reference to these Figures. Therefore, there will be no further reference to this at this stage.

Figure 3A:
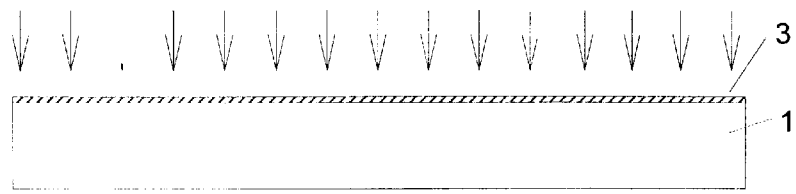
Figure 3B:
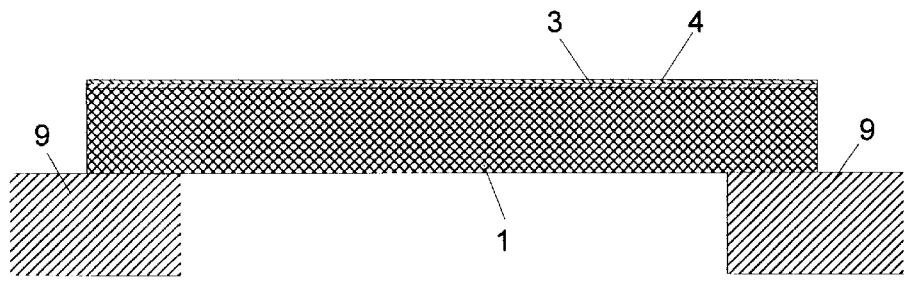
Figure 3C:
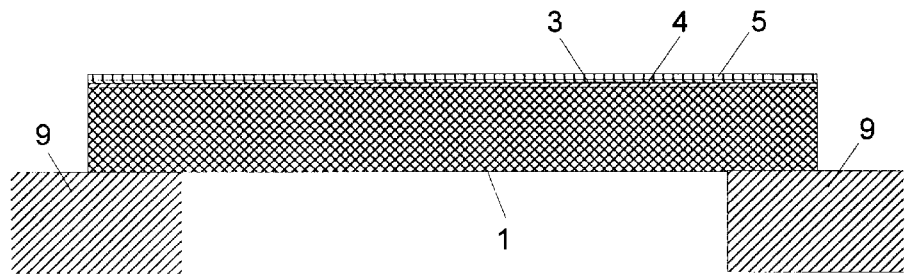
Figure 3D:
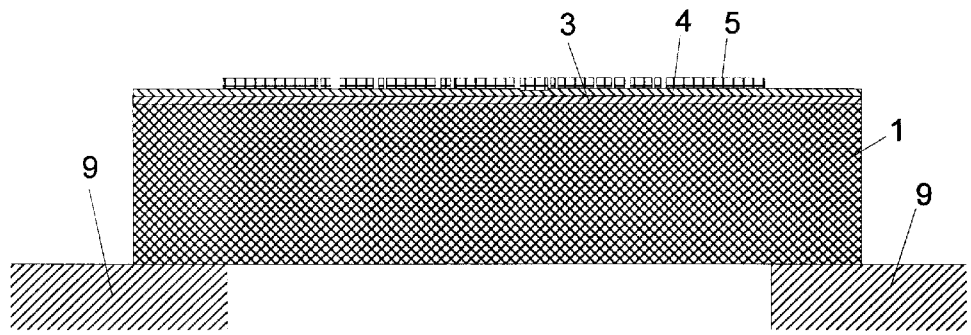
Figure 3E:
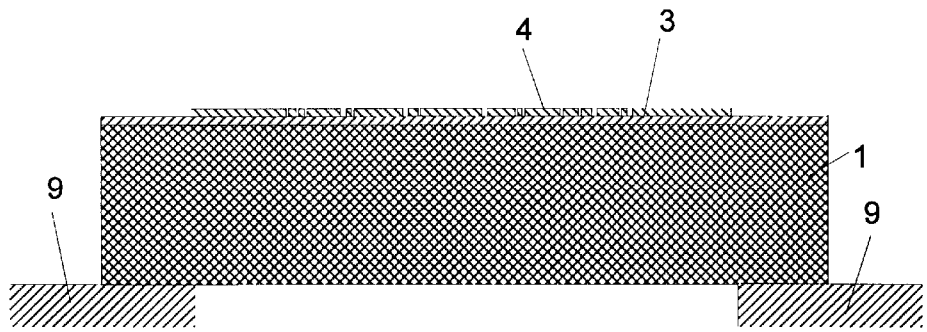
Figure 3F:
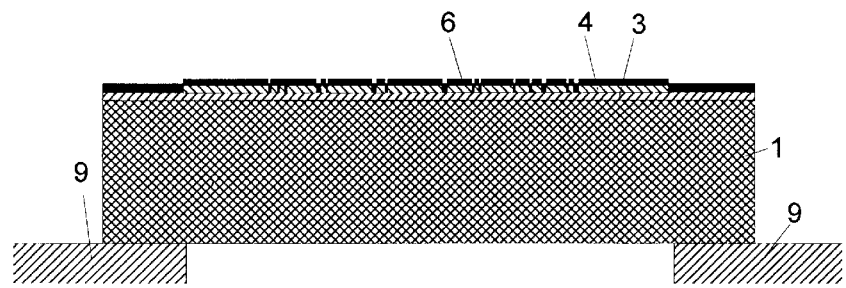
Figure 3G:
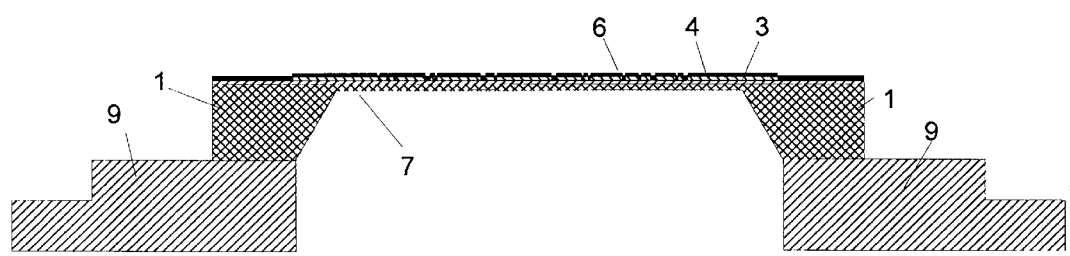
Figure 3H:
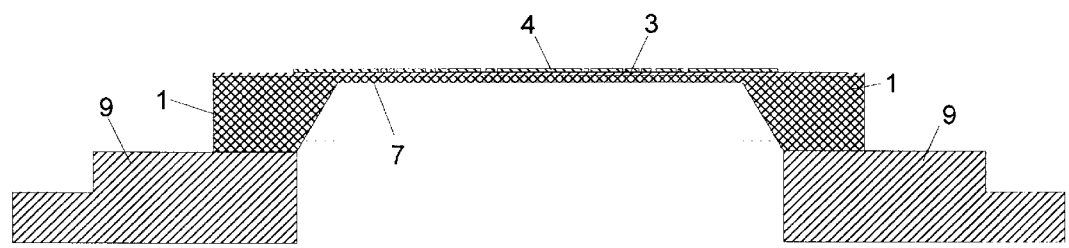
Figure 3I:
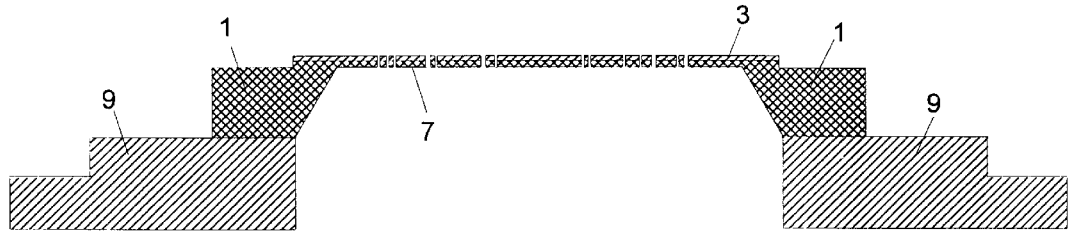

With reference to the schematic FIGS. 3a to 3i, it is to be noted that the vertical scale thereof is greatly exaggerated and for the sake of improved clarity is enlarged to a greater extent in FIGS. 3a to 3f than in FIGS. 3g to 3i. FIG. 3a shows a two-dimensional semiconductor substrate 1 of a specific conductivity type, e.g a p-conductive silicon wafer, which is doped on its upper side, e.g by ion-implantation with phosphorous or arsenic ions in order on this upper side to produce a n-doped layer 3 with a predetermined thickness. The selection of the doping material, the doping depth and the doping concentration depends substantially upon the subsequently employed thin-etching method and upon the desired stress characteristics of the mask which is to be produced. The parameters required for this purpose are known to the skilled person in this field and therefore will not be explained in detail at this juncture. In particular, reference is made in this context to the parallel applications by the Applicant, inter alia the applications DE 195 27 314 and PCT AT95/00111, which can be considered expressly as part of this disclosure.

Conventionally, the doping material, which is implanted by virtue of ionic bombardment, is activated after the ion-implantation by virtue of thermal annealing of the substrate.

Subsequently, a thin intermediate layer 4, e.g an SiON layer having a thickness of 1 $\mu$m is produced on the upper side of the doped layer 3 of the substrate 1 and grows thermally in an atmosphere which is enriched with oxygen and nitrogen (FIG. 3b). In the present case of a silicon wafer, it is also possible to apply a pure oxide layer ($SiO_2$) or a pure nitride layer ($Si_3N_4$) as an intermediate layer. Likewise, within the scope of the present invention it is also possible to produce different layers which can be structured, e.g vapour-deposited, chemically or electrochemically produced layers which are sufficiently stable for subsequent processing.

Furthermore, it is evident in FIG. 3b that the substrate 1 is now attached with its lower side along the edging to a stable frame 9, e.g a Pyrex or a silicon ring. The substrate 1 together with the frame 9 is now directed to further processing.

In the sequence, the intermediate layer 4 is structured by means of a lithographic process with the structures of the mask which is to be produced. For this purpose, a resist layer 5 is applied to the upper side of the intermediate layer 4 (FIG. 3c), which is exposed and developed in a suitable manner. Subsequently, the intermediate layer 4 is etched in the structured regions as far as to the upper side of the substrate 1 and the still present resist layer is removed (FIGS. 3d, 3e). Lithographic methods of this type are known to the person skilled in the art and will also not be explained in detail at this juncture.

In the sequence, a conductive protective layer, e.g a metal layer 6 (such as TiW) is vapour-deposited or deposited on to the structured intermediate layer 4 (FIG. 3f). In the present case, this metal layer 6 has a dual function, namely on the one hand to protect the structures of the intermediate layer from being etched and on the other hand to form an electrode for the subsequent electrochemical etch-stop method.

The electrochemical etch-stop method already discussed serves to etch the substrate 1 from the lower side in the region within the ring 9, until a membrane 7 having a predetermined thickness, e.g having a thickness amounting to several $\mu$m, remains in this region. In the case of an electrochemical etch-stop method the etching process is stopped automatically by virtue of an electrochemical passivation shortly before the p/n transition is achieved in the proximity of the boundary surface between the undoped substrate 1 and the doped layer 3. A method of this type for thin-etching silicon substrates is described in detail inter alia in the European applications EP 367 750 and EP 399 998 by the Applicant. The contents of the disclosure of this European application can therefore also be considered expressly to be a part of the present disclosure. However, within the scope of the present invention, all other known methods of thin-etching a substrate can be employed.

After the thin-etching process (illustrated in FIG. 2g), the metal protective layer 6 on the upper side of the structured layer 4 is removed, so that the structures of this masking layer become visible again (FIG. 3h). When using a TiW protective layer, hydrogen peroxide ($H_2O_2$) is recommended for the purpose of removing this layer.

In order to produce a stencil mask 8, the membrane 7 is now etched through the structures of the intermediate layer 4, e.g by reactive ion beam etching, until orifices are produced in these non-masked regions of the membrane 7, which orifices form the structures of the mask 8. Finally, the intermediate layer 4 is removed. FIG. 3i shows the stencil mask immediately after the production method has been completed.

Finally, it should also be mentioned that the illustrated and described exemplified embodiments merely serve to explain in detail the method in accordance with the invention and thus do not represent any limitation. The type of the materials used and the processing thereof can be random within the scope of the present invention, as long as the method steps in accordance with the following main claim can be accomplished.

What is claimed is:

1. Method for the purpose of producing a stencil mask, which comprises a sheet having structures in the form of orifices, wherein the method comprises the following sequence of steps:

a) selecting a flat substrate having upper and lower sides and consisting of a specific material comprising a thickness greater than 50 $\mu$m, b) producing a thin intermediate layer on the upper side of the substrate, c) structuring this intermediate layer by means of a lithographic process with the structures for the mask which is to be produced, d) etching the lower side of the substrate at least in the region of the structures provided for mask orifices, until the substrate comprises in this region a thickness less than 50 $\mu$m e) etching the upper side of the substrate using the structured intermediate layer as a masking layer, in order to form in the substrate the orifices of the mask which orifices correspond to the structures of the intermediate layer, and f) removing the intermediate layer.

2. Method according to claim 1, wherein characterised in that upon implementation of step d) an electrochemical etching process is used, wherein the structured intermediate layer is coated with a conductive layer, which is removed from the intermediate layer after the etching step.

3. Method according to claim 2, wherein the conductive layer is a metal layer, of titanium, tungsten or TiW.

4. Method according to any one of the preceding claims, characterised in that the lower side of the substrate before implementing step d) is protected from being etched along the edging of the substrate, e.g. by applying a passivation layer or by attaching a frame.

5. Method according to claim 1, wherein a stable frame is attached to the substrate before implementing one of the steps b) c) or d) in the region of the edging of the substrate.

6. Method according to claim 5, wherein a Pyrex or silicon ring is selected for the frame and said ring is attached to the substrate before step b) is implemented.

7. Method according to claim 1, wherein said substrate comprises a silicon disc having a specific conductivity type, the method further comprising applying a doping material on an upper side of said silicon disc to a thickness less than the thickness of the substrate, said doping material having a conductivity type opposite that of said substrate.

8. Method according to claim 2, wherein the intermediate layer is silicon nitride ($Si_3N_4$) or silicon oxinitride (SiON).

* * * * *